United States Patent
Hayward et al.

(10) Patent No.: US 6,381,147 B1
(45) Date of Patent: Apr. 30, 2002

(54) CARD GUIDE INCLUDING AIR DEFLECTOR MEANS

(75) Inventors: C. Michael Hayward, Harvard; Richard N. Rehlander, Billerica, both of MA (US)

(73) Assignee: Hybricon Corporation, Ayer, MA (US)

( * ) Notice: Subject to any disclaimer, the term of this patent is extended or adjusted under 35 U.S.C. 154(b) by 0 days.

(21) Appl. No.: 09/094,179

(22) Filed: Jun. 9, 1998

Related U.S. Application Data

(60) Provisional application No. 60/085,627, filed on May 18, 1998.

(51) Int. Cl.$^7$ .............................. H05K 7/20; H05K 9/00
(52) U.S. Cl. .................. 361/756; 361/690; 361/720; 361/753; 361/759; 361/816; 165/80.3
(58) Field of Search .................. 361/688, 690–697, 361/720, 753, 756, 799, 800–802, 816; 211/41.17; 206/706, 719; 174/35 R, 51; 165/80.3

(56) References Cited

U.S. PATENT DOCUMENTS

| | | | |
|---|---|---|---|
| 2,380,026 A | | 7/1945 | Clarke .................... 175/366 |
| 3,696,936 A | | 10/1972 | Straccia et al. ............ 211/41 |
| 3,878,438 A | | 4/1975 | Weisman ............ 317/101 DH |
| 3,956,673 A | * | 5/1976 | Seid |
| 3,967,874 A | | 7/1976 | Calabro ................ 339/112 R |
| 4,171,859 A | | 10/1979 | Altoz et al. ............ 339/112 R |
| 4,277,815 A | | 7/1981 | Skroupa .................... 361/383 |
| 4,293,891 A | * | 10/1981 | Matsui et al. |
| 4,322,776 A | * | 3/1982 | Job et al. .................... 361/690 |
| 4,399,485 A | | 8/1983 | Wright et al. .............. 361/383 |
| 4,466,049 A | * | 8/1984 | Chaney et al. ............. 361/691 |
| 4,478,540 A | | 10/1984 | Henneberg et al. ......... 361/424 |
| 4,505,394 A | | 3/1985 | Reimer ...................... 211/41 |
| 4,750,088 A | | 6/1988 | Friot .......................... 361/384 |
| 4,991,646 A | | 2/1991 | Spears ........................ 165/122 |
| 5,210,680 A | | 5/1993 | Scheibler ................... 361/384 |
| 5,504,657 A | * | 4/1996 | Stocco ........................ 361/800 |
| 5,563,768 A | * | 10/1996 | Perdue ........................ 361/695 |
| 5,638,259 A | * | 6/1997 | McCarthy et al. .......... 361/800 |
| 5,805,429 A | * | 9/1998 | Andersson .................. 361/799 |
| 5,940,266 A | * | 8/1999 | Hamilton et al. ............ 361/695 |
| 5,969,942 A | * | 10/1999 | Heckner et al. ............. 361/695 |
| 6,011,688 A | * | 1/2000 | Thornburg et al. .......... 361/695 |
| 6,011,689 A | * | 1/2000 | Wrycraft .................... 361/695 |

FOREIGN PATENT DOCUMENTS

| | | | |
|---|---|---|---|
| JP | 64-89396 | * | 4/1989 |
| JP | 2-4000 | * | 1/1990 |

* cited by examiner

*Primary Examiner*—Jayprakash N. Gandhi
(74) *Attorney, Agent, or Firm*—Mills & Onello LLP

(57) ABSTRACT

A card guide which optimizes the flow of forced cooling air, provides for self alignment to a host motherboard and provides for integrated ESD hazard mitigation, includes an elongated body having a groove disposed along a longitudinal axis of the body. The groove is adapted for receiving the edge of an inserted daughter card. The card guide further includes integral, arcuate inner and outer deflectors, which form a channel for redirecting incident air flow toward regions of the daughter card which would otherwise be blocked from the air flow. The end of the card guide that receives the daughter card houses an ESD clip. The ESD clip functions to dissipate static charge accumulated on the daughter card from a conductive strip disposed along the edge of the daughter card. The ESD clip further serves to dissipate accumulated static charge from a front panel attached to the daughter card, via a guide pin fixedly attached to the front panel. The end of the card guide proximate to the motherboard includes an alignment pin, which engages a corresponding aperture in the motherboard to properly register the card guide to the associated connector on the motherboard.

27 Claims, 7 Drawing Sheets

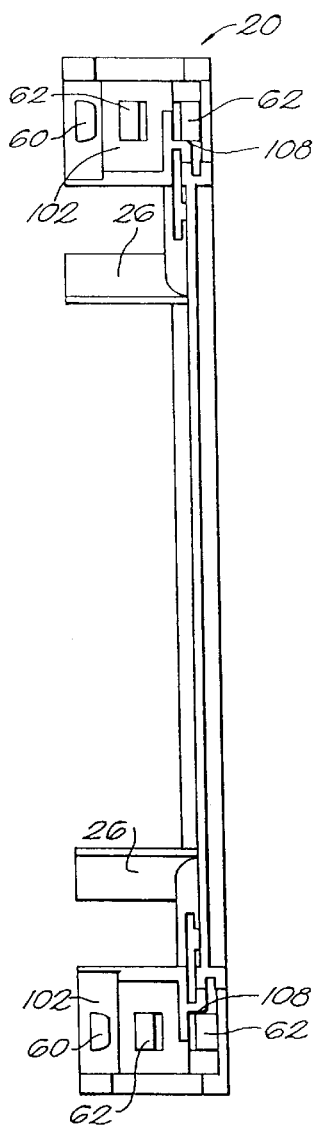
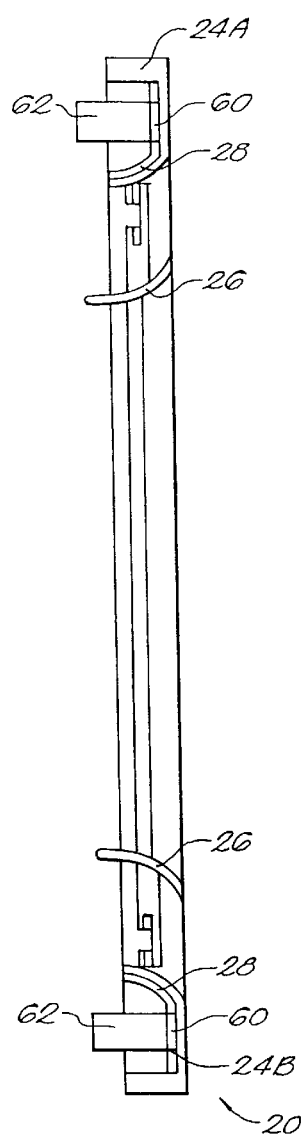
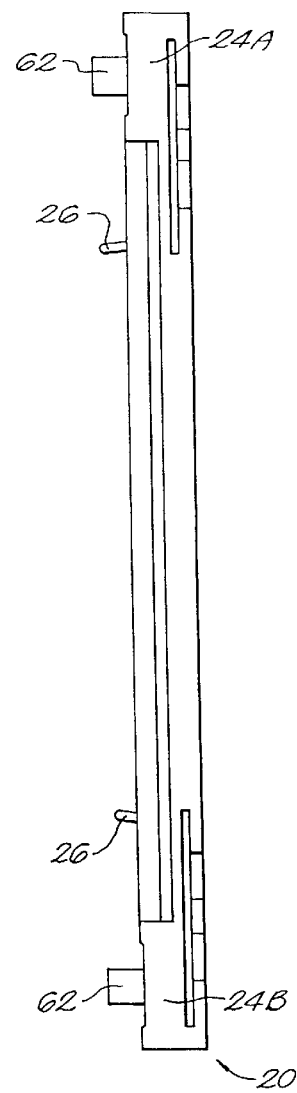
FIG. 5
FIG. 6
FIG. 7

CARD GUIDE INCLUDING AIR DEFLECTOR MEANS

RELATED APPLICATION

This application claims the benefit of U.S. Provisional Application No. 60/085,627, filed on May 18, 1998, the contents of which are incorporated herein by reference.

BACKGROUND OF THE INVENTION

Modem backplanes, also referred to as motherboards, serve as a communication medium for the exchange of electronic signals between a plurality of daughter cards. Circuitry on each daughter card generates communication signals, which are distributed to connectors mounted along an edge of the daughter card. Daughter card connectors mate with a corresponding set of backplane connectors typically arranged in equidistant rows on the backplane for providing interconnect and distribution of signals therebetween.

A chassis houses the backplane, daughter cards, and corresponding connectors. The chassis frame includes side panels and cross members, also referred to as extrusion rails. Card guides mounted on the extrusion rails run from the front to the rear of the chassis to guide the daughter cards into proper alignment with corresponding backplane connectors. Each daughter card position in the chassis is referred to as a card slot. The relative positioning of the card guides with respect to the mother board is critical, since the relative positioning determines how well the daughter card connectors align with the motherboard connectors during daughter card insertion. Consequently, motherboard alignment has traditionally required special tooling and procedures, and has been a tedious and time-consuming portion of chassis assembly.

In general, daughter cards to be inserted into a motherboard chassis assembly may accumulate a significant static charge during storage and handling. This static charge must be discharged prior to electrically coupling the daughter card to the system via the motherboard connector, so as to prevent ESD damage to the system. In addition, the front panel assembly of a daughter card may include a number of cable connectors electrically coupled to external cables. Such cables and cable connectors may also provide a source of significant static charge which must be discharged to prevent ESD damage to the system. A number of prior art methods exist for discharging daughter card ESD and for discharging front panel ESD. However, such prior art methods typically utilize separate, distinct mechanisms for discharging each source of static charge.

During operation, the electrical components on the daughter cards generate heat which must be extracted to prevent thermal damage. A popular means for inducing heat transfer is a cooling apparatus which forces a volume of cooled air through the chassis. The cooled air removes heat from the electrical components by means of thermal convection. The resulting warmed air is ventilated, or otherwise cooled and re-circulated.

As air flows past structural features on the chassis, for example the extrusion rails, the interference causes turbulence in the air flow. Turbulence results in regions of marginal air flow, which if proximal to the daughter cards, can cause "hot spots" to form on the daughter cards. To avoid this problem, card designers refrain from populating components in the "hot spot" regions, and card surface area is therefore underutilized. This is a most undesirable approach because as electronics become increasingly sophisticated, daughter card surface area is at a premium.

U.S. Pat. No. 4,750,088, issued Jun. 7, 1988 and incorporated herein by reference, addresses this issue by providing a number of air deflectors having a wedge-shaped cross section. The deflectors are extruded members mounted across the top and bottom portions of the chassis, parallel to the extrusion rails, for directing cooling air into marginal areas of the daughter cards, proximal to the extrusion rails. However, this configuration complicates construction of the chassis by requiring additional hardware, which, in turn, lengthens the time and cost for production of the chassis assembly.

SUMMARY OF THE INVENTION

In a first aspect, the present invention relates to card guides, and more particularly to card guides which optimize the flow of forced cooling air, provide for self alignment to a host motherboard and provide for integrated ESD hazard mitigation. The present invention is directed to a card guide configured to maximize air flow across circuit boards mounted in a card cage in a manner which mitigates and/or eliminates regions of marginal air flow. As a result, circuitry can be populated on the daughter card in regions proximal to the extrusion rails, allowing for more efficient use of daughter card surface area.

The present invention achieves this result in a manner which overcomes the limitations of the prior art. Specifically, air deflectors are incorporated into the body of the improved card guides, and the improved card guides are mounted to the chassis in a manner similar to the manner in which standard card guides are mounted. Unlike the prior art technique described above, additional hardware is not needed to redirect air flow about the extrusion rails and construction of the chassis is simplified.

A card guide in accordance with the present invention is adapted for mounting to a circuit card chassis having extrusion rails or cross members. The card guide is further adapted for channeling a daughter card toward a motherboard assembly, so as to ensure proper registration of the daughter card connector with a motherboard connector. The card guide comprises an elongated body having a groove along its longitudinal axis for receiving the edge of a circuit card. The body is adapted for mounting to the extrusion rails. At least one air deflector is laterally coupled to the body, and extends in a direction substantially transverse to the longitudinal axis for redirecting incident air flow about the rail.

In a preferred embodiment, the air deflector is integral with the card guide. The air deflector is preferably arcuate in cross section to optimize the efficiency of air flow. Fabrication of the card guide may be accomplished via injection molding techniques, or by other techniques known in the art. Standard mounts are preferably included at opposite ends of the card guide body for mounting the card guide to the extrusion support rails. Additional air deflectors, integral with the mounts, may also be included. Mounting features of the mounts may include a latching mechanism which extends transversely from the body of the card guide, and fixedly engages a corresponding aperture in the support rail.

In a second aspect, the body of the card guide includes an ESD clip having a base, a wiper blade and a barrel receptacle, all three of which are electrically conductive and electrically coupled to one another. The base of the ESD clip includes a terminal for electrically coupling to the extrusion support rail. The wiper blade extends through the body into the groove along the longitudinal axis, so as to facilitate electrical coupling to a conductive edge of the daughter card. The barrel receptacle is disposed adjacent to and coaxial with a guide aperture in the card guide body. When a daughter card is inserted into the chassis and mates with the motherboard, the barrel receptacle receives and electrically couples to an electrically conductive guide pin fixedly attached to a front panel of the daughter card.

In a third aspect, the body of the card guide includes an alignment pin, fixedly attached to an end of said body proximal to the motherboard assembly. The alignment pin extends from the body in a direction substantially parallel to the longitudinal axis, and is operative to engage a corresponding aperture in said motherboard, so as to substantially align the card guide to the motherboard.

BRIEF DESCRIPTION OF THE DRAWINGS

The foregoing and other objects, features and advantages of the invention will be apparent from the more particular description of preferred embodiments of the invention, as illustrated in the accompanying drawings in which like reference characters refer to the same parts throughout the different views. The drawings are not necessarily to scale, emphasis instead being placed upon illustrating the principles of the invention.

Prior Art

FIG. 5 illustrates a bottom view of the card guide of FIG. 4;

FIG. 6 illustrates a first side view of the card guide of FIG. 4, including the face from which the air deflectors perpendicularly extend;

FIG. 7 illustrates a second side view of the card guide of FIG. 4;

DETAILED DESCRIPTION OF THE INVENTION

Figure 1:
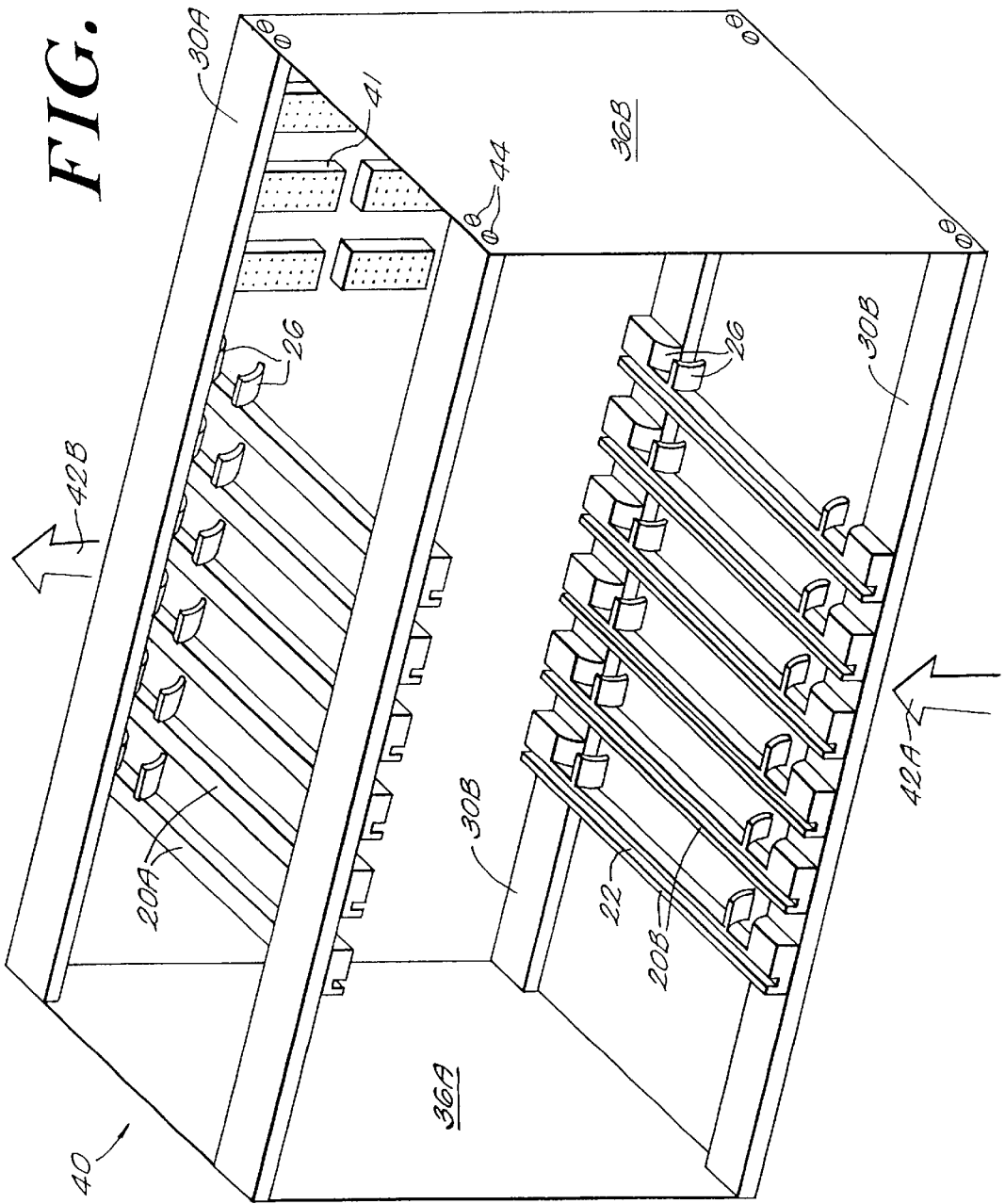
FIG. 1 is a perspective view of a card cage including card guides configured with lateral air deflectors in accordance with the present invention.

FIG. 1 is a perspective view of a card cage 40 including card guides 20A, 20B configured with lateral air deflectors 26 in accordance with the present invention. The card cage 40 comprises a substantially rectangular frame including a pair of opposing side panels 36A, 36B held in spaced, parallel relationship and coupled by means of upper and lower cross members 30A, 30B. A plurality of upper and lower card guides 20A, 20B are captively held, in a manner standard in the art, between front and rear cross member support rails 30A, 30B as shown in FIG. 1. The card guides 20A, 20B include a longitudinal groove 22 adapted to receive and align an inserted daughter card with backplane connector rows 41 at the rear of the card cage 40.

During operation, cooling air is pumped through the card cage 40 in the direction of arrow 42A. The cooling air 42A enters the lower portion of the card cage 40 between lower card guides 20B and about front and rear cross members 30B. Air deflectors 26 integral with the card guides 20A, 20B and extending laterally therefrom, preferably in a direction substantially transverse to the longitudinal axis of the guide, redirect the pumped air 42 about the cross members 30A, 30B. This promotes air flow across portions of the daughter card which otherwise would have been shielded by the body of cross members 30A, 30B and therefore would have been subject to marginal or non-existent air flow. From there, the cooled air passes across the surface of the inserted daughter cards (not shown) and exits at the top portion of the card cage between upper card guides 20A and about front and rear upper cross members 30A in the direction of arrow 42B. The released air 42B, warmed by heat energy extracted from the daughter card components, is re-circulated and cooled, or otherwise vented.

In a preferred embodiment, the cross members 30A, 30B comprise extruded members, each member having a row of longitudinally-extending holes that are sized to receive screws 44 for mounting to side panels 36A, 36B. The cross members 30A, 30B include a series of evenly spaced apertures or sockets, in accordance with well-known configurations, adapted to captively secure card guides 20A, 20B and to ensure proper spacing and alignment of the card guides.

Figure 2:
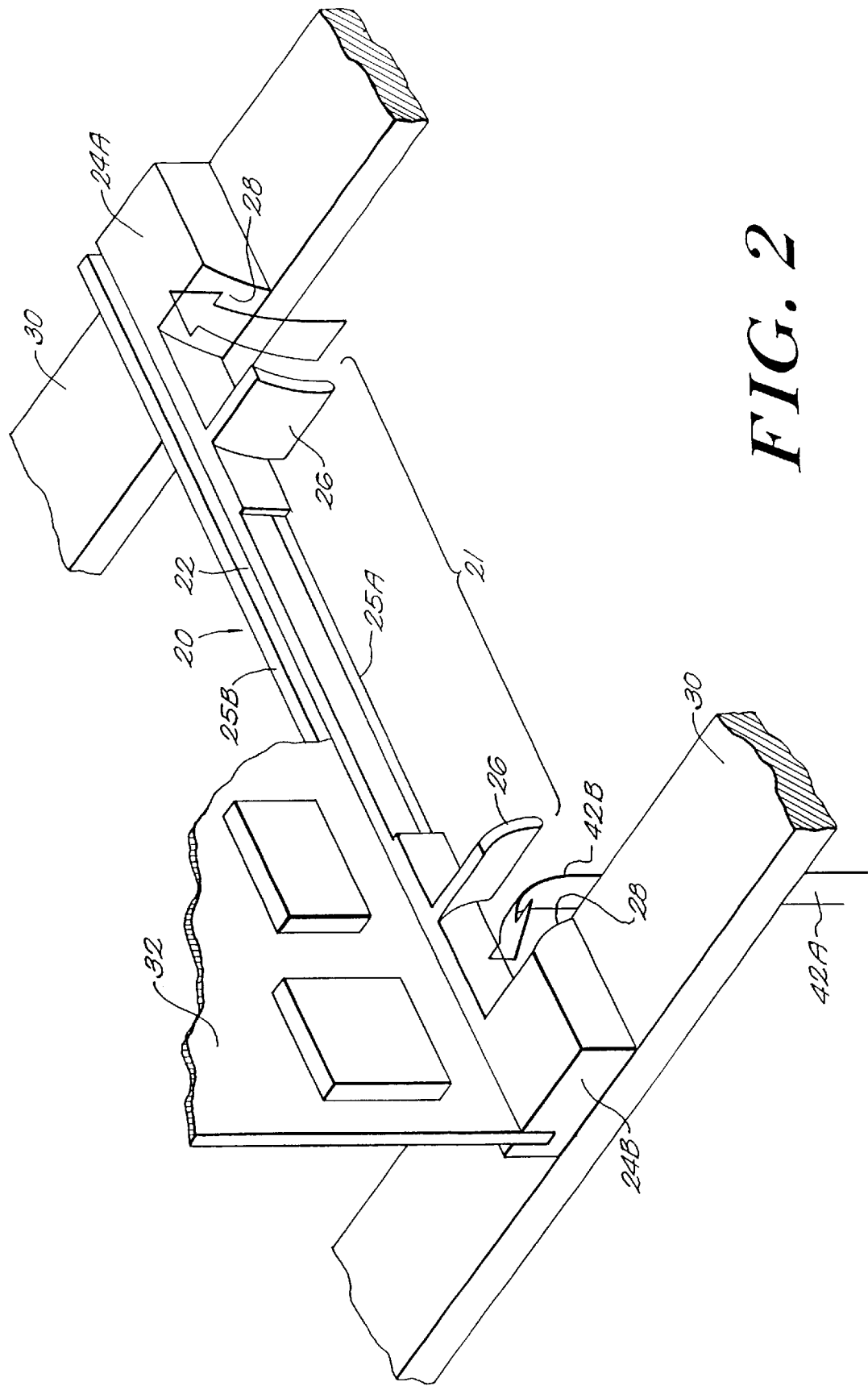
FIG. 2 is a close-up perspective view of a card guide mounted between extrusion rails, and an inserted daughter card in accordance with the present invention.

A close-up perspective illustration of a card guide 20 in accordance with a preferred embodiment of the present invention is illustrated in FIG. 2. The card guide 20 includes an elongated body 21 having a groove 22 along a longitudinal axis of the body 21. The groove 22 is adapted for receiving the edge of an inserted daughter card 32. Mounts 24A, 24B, preferably integral with the body 21, are included for mounting the card guide 20 to the cross members 30A, 30B.

The card guide 20 further includes arcuate inner deflectors 26 and outer deflectors 28. Each pair of inner and outer deflectors 26, 28 respectively form a channel for redirecting incident air flow 42A, as shown in arrow 42B, toward regions of the daughter card which otherwise would be blocked by the air flow. In a preferred embodiment, the inner deflectors 26 extend laterally from the body 21, while the outer deflectors 28 are formed on the face of the mounts 24A, 24B as shown. Alternatively, the outer deflectors 28 may also extend laterally from the body 21. A number of deflectors 26, 28 may be positioned along the length of the body to redirect air flow, as needed.

The card guide body 22 preferably has a substantially Y-shaped cross-sectional profile including a narrow head 25A and a wide base 25B. Such a profile provides minimal resistance to air flow and therefore allows for increased cooling of components. The advantages of the Y-shaped profile card guides are fully described in U.S. Pat. No. 4,750,088, incorporated herein by reference.

Figure 3A:
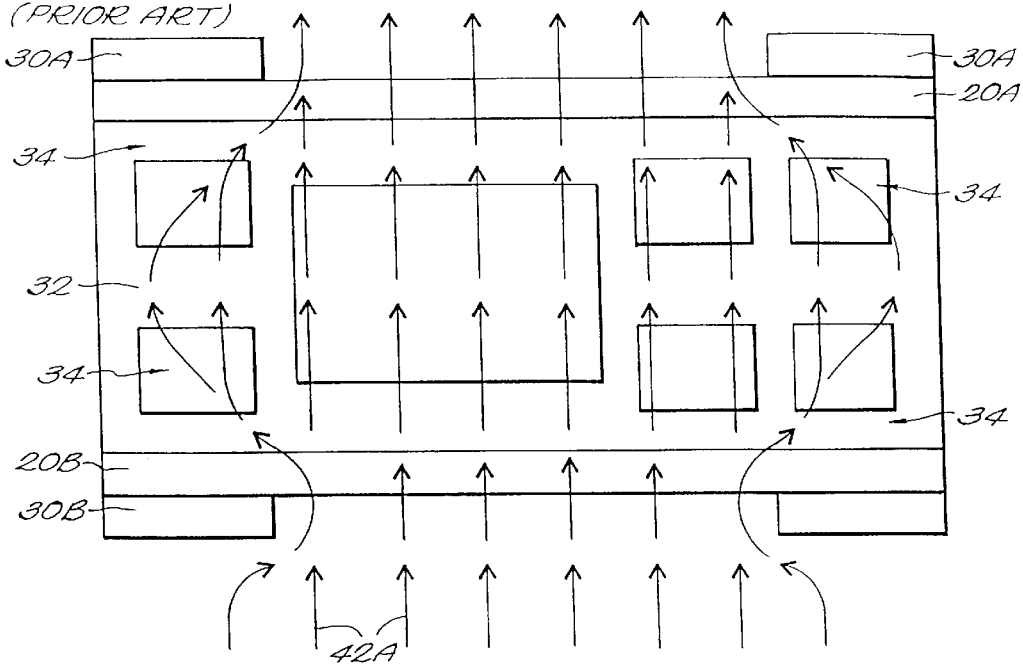
FIG. 3A is a front view of air flow across the face of a daughter card using standard card guides in accordance with the prior art.

FIG. 3A is a front view of air flow across a daughter card 32 mounted in a chassis using card guides 20A, 20B in accordance with the prior art. Incident cooling air 42A flows about cross members 30 and past lower card guide 20B. This results in air turbulence which generates regions of marginal air flow 34, also referred to as "hot regions" proximal to the lower and upper cross members 30B, 30A.

Figure 3B:
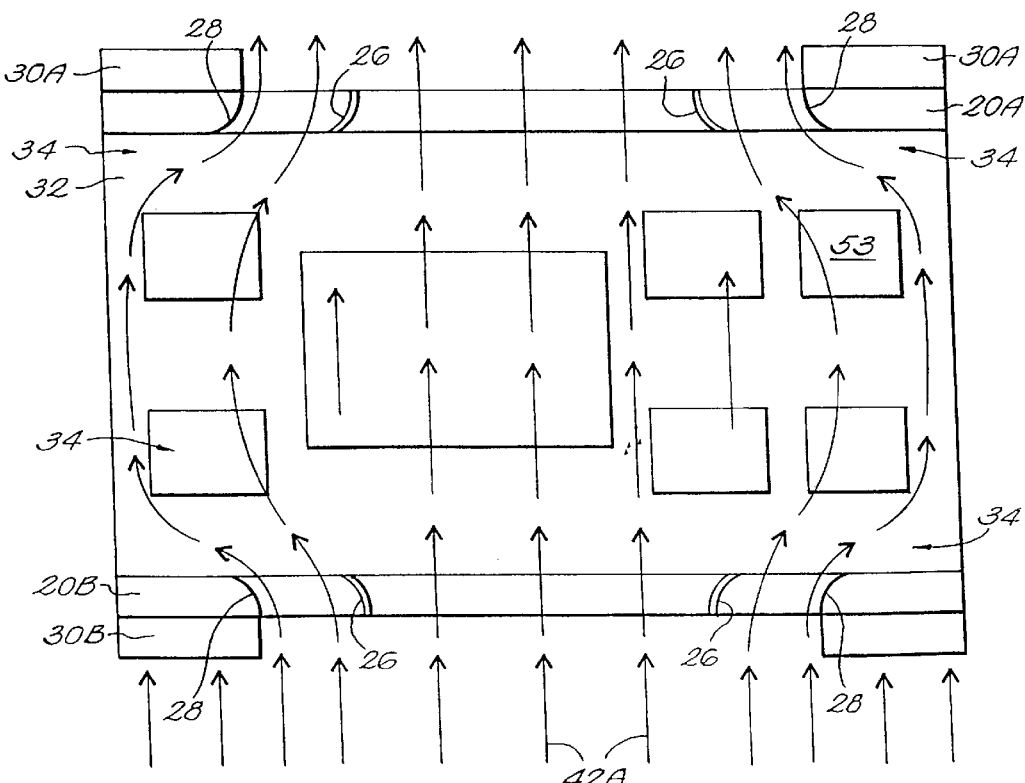
FIG. 3B is a front view of air flow across the face of a daughter card using improved card guides having integral transversely-disposed air deflectors in accordance with the present invention.

FIG. 3B is a front view of a configuration employing card guides 20A, 20B in accordance with the present invention. Incident air 42A is redirected by air deflectors 26, 28 into the regions 34 proximal to the cross members 30B, mitigating and/or eliminating turbulence proximal to the extrusion rails. Likewise, in the exit area near the upper cross members 30A, the air deflectors 26, 28 promote air flow through regions 34 and mitigate turbulence. Components 53 populated in those regions 34 can therefore be properly cooled, allowing for efficient use of daughter card surface area.

In this manner, a card guide is provided which maximizes air flow across circuit boards mounted in a card cage in a manner which mitigates and/or eliminates regions of marginal air flow. By incorporating air deflectors in the body of the card guides, construction of the chassis is simplified with respect to the prior art, and additional hardware is not necessary.

Preferred card guide dimensions are defined in IEEE Mechanical Specification Draft 5.0 P1101.10, incorporated herein by reference, based on a universal standard set forth for well known VME 64 Extension and Compact PCI configuration. For example, the card guide of the present invention may comprise a guide of width 0.8 inches at its widest point, designed for a printed circuit card of 160 mm in length.

The air deflector may be of a size ranging, for example, between 0.2 inches and 0.4 inches in width. The deflector preferably comprises a blade having inner and outer arcuate faces which preferably are parallel and of a radius between 0.35 and 0.5 inches. The arc is preferably 30 degrees to 90 degrees. In an alternate embodiment, the deflector may be configured in a wedge shape, as shown in U.S. Pat. No. 4,750,088. Other deflector arrangements are applicable. In a preferred embodiment, the card guides are fabricated from a relatively rigid plastic material, although in alternate embodiments the card guides may be fabricated from metal or composite materials known to those in the art. The card guides are preferably fabricated via general molding techniques known to those in the art, although other techniques such as injection molding, casting, stamping and extrusion may also be utilized to fabricate the card guides.

Figure 4:
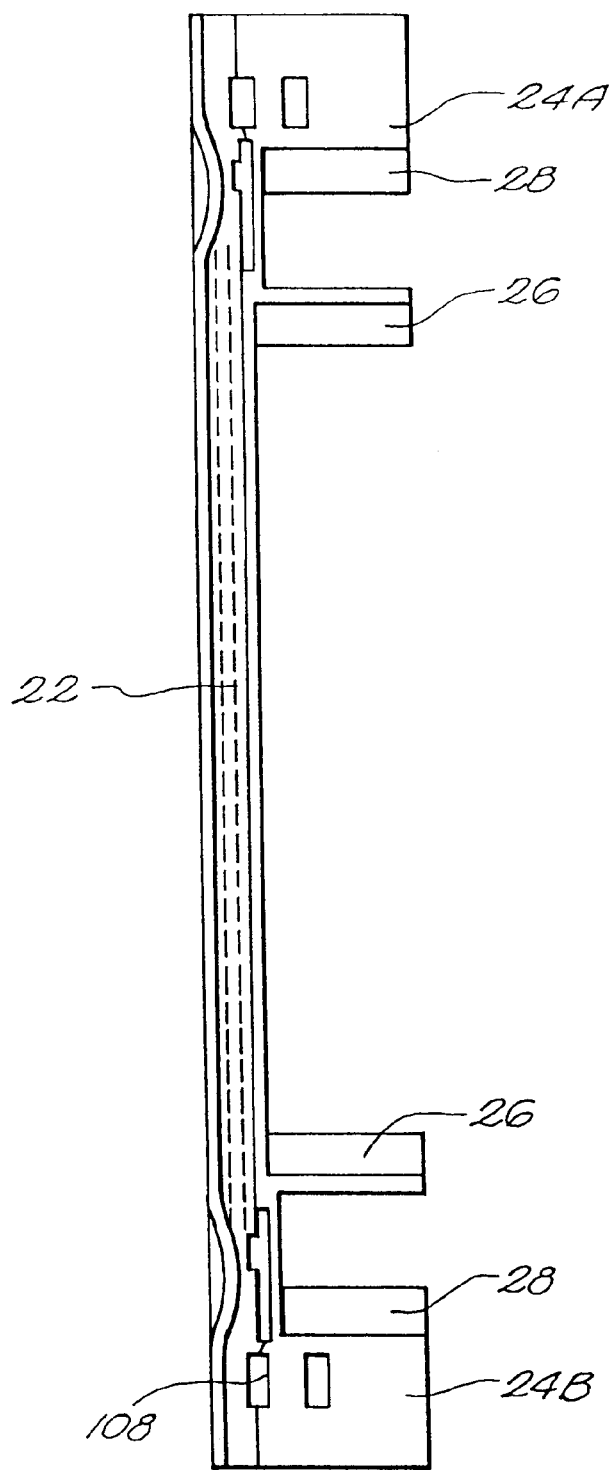
FIG. 4 illustrates a top view of a preferred embodiment of the card guide, including the face along which the longitudinal groove is disposed.
Figure 8:
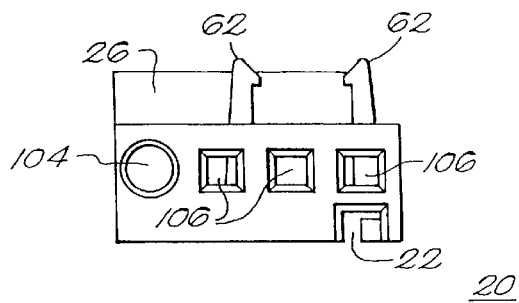
FIG. 8 illustrates an end view of the card guide of FIG. 4.
Figure 9:
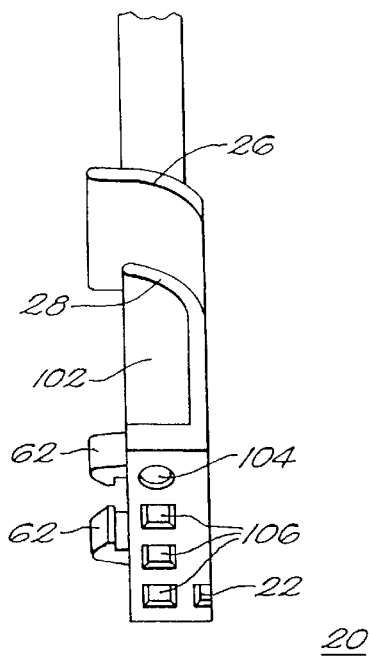
FIG. 9 illustrates a perspective view of the end of the card guide of FIG. 8.

FIGS. 4, 5, 6, 7, 8, and 9 provide various views of a preferred embodiment of the card guide 20. FIG. 4 illustrates a view of the face of the card guide 20 along which the longitudinal groove 22 is disposed, and thus is adjacent to the inserted daughter card. FIG. 5 illustrates a view of the card guide 20 consistent with rotating the card guide 20 shown in FIG. 4 180 degrees about an axis collinear with the longitudinal groove 22. The face of the card guide 20 shown in FIG. 4 is adjacent to the cross members 30A, 30B. The view in FIG. 5 also illustrates the integral card guide mounting clips 62 which latch into the apertures of the cross members 30A and 30B. FIG. 6 illustrates the face of the card guide 20 from which the air deflectors 26 perpendicularly extend. This view also illustrates an end view of the mounting clips 62. FIG. 7 illustrates a view of the card guide consistent with rotating the card guide as shown in FIG. 6 180 degrees about an axis collinear with the longitudinal groove 22. FIG. 8 illustrates an end view of the card guide 20. This view shows a round alignment aperture 104 and three square keying apertures 106. Key pins may be inserted into one or more of the three square keying apertures 106. The key pins are offset to one side, so that when they are inserted in a specific manner (as the offset can be in any of 4 positions), a particular card slot can be protected from the insertion of a module card into an incorrect slot. The round alignment aperture 104 has utility both as a socket for a fixedly attached alignment pin 120, and also as a receptacle for a guide pin mounted to a front panel of the daughter card; both uses are described in more detail hereinafter. In this preferred embodiment, the card guide 20 is symmetrical about a plane which perpendicularly intersects an axis which is collinear with the longitudinal groove 22, at a point which exactly bisects the length of the groove 22. Thus, a view of the opposite end of the card guide 20 is a mirror image of the view shown in FIG. 8. FIG. 9 illustrates an end of the card guide 20, tilted at an angle of approximately 45 degrees. This view shows the apertures 104 and 106 at the end of the card guide, along with a view of the cavity 102 within the mounts 24A and 24B.

Figure 10:
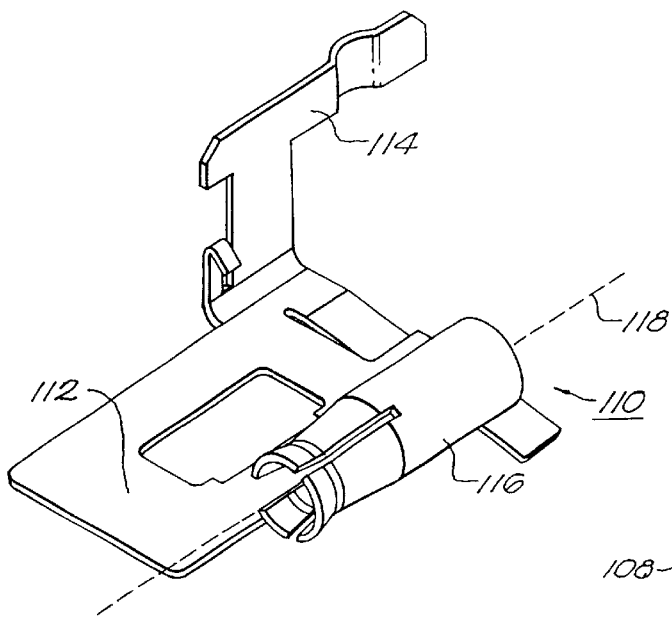
FIG. 10 is a perspective view of an ESD clip in accordance with the present invention.

FIG. 10 shows a perspective view of an ESD clip 110. The ESD clip 110 provides means for dissipating static charge accumulated on a daughter card, prior to the daughter card engaging the motherboard. In the view of the card guide 20 shown in FIG. 5, the end of the card guide 20 distal to the motherboard includes a cavity 102 which houses the ESD clip 100. One side of the cavity 102 (which corresponds to the outward, end face of the card guide) includes a round guide pin aperture 104 and three square keying pin apertures 106. The side of the cavity which is adjacent to the longitudinal groove 22 includes a square aperture 108 which extends through the card guide and into the longitudinal groove shown in FIG. 4. The ESD clip 110 includes three ESD components; a base 112, a wiper blade 114 and a barrel receptacle 116, all of which are electrically conductive and electrically coupled to one another. In one preferred embodiment, the base 112, wiper blade 114 and barrel receptacle 116 are fabricated from a single piece of conductive material, although other embodiments may include non-conductive materials which provide mechanical support for separate, electrically conductive ESD components. The base of the ESD clip is electrically coupled to the cross member 30, which provides a current sink for the electrostatic charge accumulated on the daughter card.

The wiper blade 114 extends through the card guide 20 and into the longitudinal groove 22 (see FIG. 4) which guides the daughter card into the card cage. As the daughter card is inserted into the groove 22 of the card guide 20, a conductive strip located at the edge of the daughter card makes electrical contact with the wiper blade 114, so that a static charge built up on the daughter card may discharge from the conductive strip to the cross members 30 via the wiper blade 114 and base 112 of the ESD clip 110, as required by IEEE 1101.10.

The barrel receptacle 116 is disposed about a receptacle axis 118. The barrel receptacle 116 is positioned adjacent to an alignment aperture 104 in the front card guide face, such that the receptacle axis 118 is collinear with the axis of the alignment aperture 104. The axis of the alignment hole 104 intersects the center of the alignment aperture 104 and is perpendicular to the radius of the alignment aperture 104. As the daughter card is inserted into the card guide, a front panel guide pin fixedly attached and electrically coupled to the daughter card front panel travels along a path which is approximately collinear with the receptacle axis 118. As the daughter card completes its travel into the card cage 40 and the daughter card connector mates with the motherboard connector, the front panel guide pin travels through the alignment hole and electrically couples to the barrel receptacle 116.

In this manner, static discharge current (up to 25 amperes) from connectors mounted to the front panel can travel through the guide pin to the cross members 30 that support the card guide 20, via the barrel receptacle 116 and the base 112, thus mitigating the potential hazard of electrostatic discharge into the motherboard connector.

Figure 11:
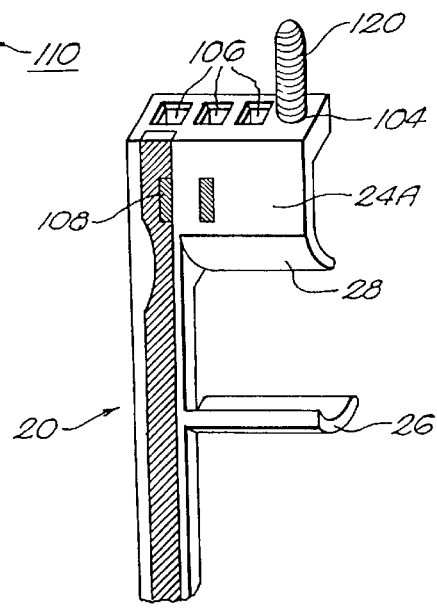
FIG. 11 is a perspective view of an alignment pin fixedly attached to a card guide, in accordance with the present invention; and, FIG. 12 shows an embodiment of the invention which includes two or more card guides joined by one or more elongated air deflectors having an arcuate cross section, forming an integral, multiple card guide unit.

FIG. 11 is a perspective view of an alignment pin 120 fixedly attached to a card guide 20, in accordance with the present invention. The alignment pin 120 is fixedly attached to an end of the card guide body proximal to the motherboard assembly, and extends from the body in a direction substantially parallel to the longitudinal axis of the card guide body. In a preferred embodiment of the invention, the alignment pin 120 is press-fit, in a manner known to those in the art, into the alignment aperture 104.

The alignment pin 120 engages a corresponding aperture in said motherboard, so as to substantially align the card guide to the motherboard without having to resort to traditional time consuming alignment procedures. Thus, the connectors of daughter cards inserted into the chassis via the card guides will substantially align to the corresponding motherboard connectors.

Figure 12:
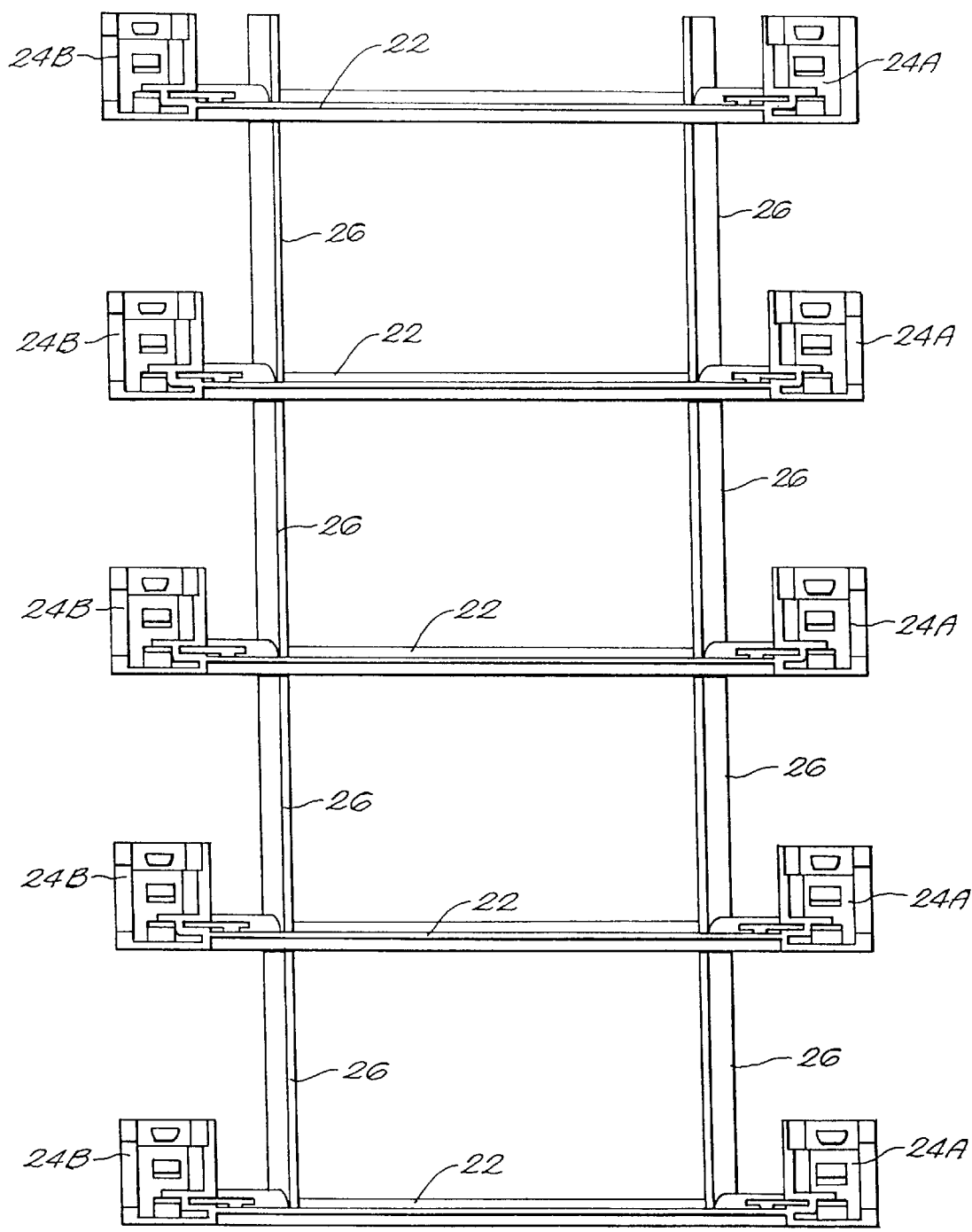

Although the preferred embodiment of the invention includes individual, discrete card guides having integral air deflectors, other embodiments may include two or more card guides joined by one or more elongated air deflectors having an arcuate cross section, forming an integral, multiple card guide unit as shown in FIG. 12. Alternately, the multiple card guides may be joined by other means, such as integral or discrete cross-members with the elongated air deflectors being merely attached to the multiple card guides, rather than structurally joining the card guides.

While this invention has been particularly shown and described with references to preferred embodiments thereof, it will be understood by those skilled in the art that various changes in form and details may be made therein without departing from the spirit and scope of the invention as defined by the appended claims.

What is claimed is:

1. A card guide for guiding a daughter card toward a motherboard assembly, so as to ensure proper registration of a daughter card connector with a motherboard connector, said card guide mountable to a support rail of a daughter card chassis, comprising:
    an elongated body having a groove provided along a vertical axis of the body and extending along a longitudinal axis of said body for receiving an edge of said daughter card; and
    at least one air deflector extending outwardly from said body in a direction transverse to the longitudinal axis, the air deflector including an air deflecting surface extending in the transverse direction and along the longitudinal axis at an acute angle with respect to the vertical axis, for redirecting incident air flow.

2. A card guide according to claim 1, wherein said air deflecting surface is arcuate in cross-section.

3. A card guide according to claim 1, wherein said air deflecting surface is linear in cross section.

4. A card guide according to claim 1, wherein said air deflector is integral with said body, such that said at least one air deflector and said body form a single unit.

5. A card guide according to claim 4, wherein said card guide consists of a material selected from the group consisting of plastic, metal and composite material.

6. A card guide according to claim 4, wherein said card guide is formed via a fabrication technique selected from the group consisting of molding, injection molding, casting, stamping and extrusion.

7. A card guide according to claim 1, further including mounting features at opposite ends of said body for mounting said card guide to said support rail.

8. A card guide according to claim 7, wherein said mounting features include a latching mechanism extending from said body, substantially transverse to said longitudinal axis, said latching mechanism being operative to fixedly engage a corresponding aperture in said support rail.

9. A card guide according to claim 8, wherein the chassis includes cross members, and wherein the at least one air deflected is positioned to redirect air about said cross member.

10. A card guide according to claim 7, wherein the mounting features include integral air deflectors.

11. A card guide according to claim 1, wherein said body includes an electrostatic-discharge ESD clip having a base, a wiper blade and a barrel receptacle, all three of which are electrically conductive and electrically coupled to one another, said base having a terminal for electrically coupling to said rail, said wiper blade extending through said body into said groove for electrically coupling to a conductive edge of said daughter card, and said barrel receptacle being disposed adjacent to and coaxial with a guide aperture in said body for receiving and electrically coupling to an electrically conductive guide pin fixedly attached to a front panel of said daughter card.

12. A card guide according to claim 1, wherein said body includes an alignment pin, fixedly attached to an end of said body proximal to said motherboard assembly, said alignment pin extending from said body in a direction substantially parallel to said longitudinal axis, and being operative to engage a corresponding aperture in said motherboard, so as to substantially align said card guide to said motherboard.

13. A card guide according to claim 1 further comprising mounting features at proximal and distal ends of said body for mounting the card guide to a support rail, wherein the air deflecting surface redirects incident air flow into a region above the mounting features.

14. A card guide assembly for guiding a plurality of daughter cards toward a motherboard assembly, so as to ensure proper registration of a plurality of daughter card connectors with a corresponding plurality of motherboard connectors, comprising:
    at least two elongated bodies each having a groove provided along a vertical axis of the body and extending along a longitudinal axis of said body for receiving an edge of one of said plurality of daughter cards; and
    at least one air deflector extending in a transverse direction between said bodies, the air deflector including an air deflecting surface extending in the transverse direction and along the longitudinal axis at an acute angle with respect to the vertical axis, for redirecting incident air flow.

15. A card guide assembly according to claim 14, wherein said air deflecting surface is arcuate in cross-section.

16. A card guide assembly according to claim 14, wherein said air deflecting surface is substantially linear in cross section.

17. A card guide assembly according to claim 14, wherein said at least one air deflector is integral with said bodies, such that said at least one air deflector and said bodies form a single unit.

18. A card guide assembly according to claim 17, wherein said card guide assembly consists of a material selected from the group consisting of plastic, metal and composite material.

19. A card guide assembly according to claim 14, wherein each of said bodies includes an electrostatic-discharge ESD clip having a base, a wiper blade and a barrel receptacle, all three of which are electrically conductive and electrically coupled to one another, said base having a terminal for electrically coupling to said rail, said wiper blade extending through each of said bodies into said groove for electrically coupling to a conductive edge of each of said plurality of daughter cards, and said barrel receptacle being disposed adjacent to and coaxial with a guide aperture in each of said bodies for receiving and electrically coupling to an electrically conductive guide pin fixedly attached to a front panel of each of said plurality of daughter cards.

20. A card guide assembly according to claim 14, wherein each of said bodies includes an alignment pin, fixedly attached to an end of each of said bodies proximal to said motherboard assembly, said alignment pin extending from each of said bodies in a direction substantially parallel to said longitudinal axis, and being operative to engage a corresponding aperture in said motherboard, so as to substantially align each of said card guides to said motherboard.

21. A card guide for guiding a daughter card toward a motherboard assembly, so as to ensure proper registration of a daughter card connector with a motherboard connector, said card guide mountable to a support rail of a daughter card chassis, comprising:

an elongated body having a groove along a longitudinal axis of said body for receiving an edge of said daughter card;

first and second mounting features at proximal and distal ends of said body for mounting the card guide to a support rail; and first and second air deflectors extending outwardly from said body in a direction transverse to the longitudinal axis, for redirecting incident air flow into a region above, and proximal to, the respective first and second mounting features.

22. A card guide according to claim 21 wherein the groove is provided along a vertical axis of the body and extends along the longitudinal axis of the body for receiving the edge of a daughter card; and wherein the air deflector includes an air deflecting surface extending in the transverse direction and along the longitudinal axis at an acute angle with respect to the vertical axis, for redirecting incident air flow.

23. A card guide according to claim 22, wherein said air deflecting surface is arcuate in cross-section.

24. A card guide according to claim 22, wherein said air deflecting surface is substantially linear in cross section.

25. A card guide according to claim 21, wherein said air deflector is integral with said body, such that said air deflector and said body form a single unit.

26. A card guide according to claim 25, wherein said card guide consists of a material selected from the group consisting of plastic, metal and composite material.

27. A card guide according to claim 25, wherein said card guide is formed via a fabrication technique selected from the group consisting of molding, injection molding, casting, stamping and extrusion.

* * * * *

UNITED STATES PATENT AND TRADEMARK OFFICE
CERTIFICATE OF CORRECTION

PATENT NO.   : 6,381,147 B1
DATED        : April 30, 2002
INVENTOR(S)  : C. Michael Hayward et al.

It is certified that error appears in the above-identified patent and that said Letters Patent is hereby corrected as shown below:

<u>Column 8,</u>
Line 12, change "deflected" to "deflector". --

Signed and Sealed this

Twenty-sixth Day of November, 2002

*Attest:*

*Attesting Officer*

JAMES E. ROGAN
*Director of the United States Patent and Trademark Office*